United States Patent [19]

Slingerland

[11] Patent Number: 4,820,898
[45] Date of Patent: Apr. 11, 1989

[54] ION BEAM APPARATUS FOR FINISHING PATTERNS

[75] Inventor: Hendrik N. Slingerland, Delft, Netherlands

[73] Assignee: U.S. Philips Corporation, New York, N.Y.

[21] Appl. No.: 85,991

[22] Filed: Aug. 14, 1987

[30] Foreign Application Priority Data

Aug. 27, 1986 [NL] Netherlands ............... 8602176

[51] Int. Cl.⁴ .............................................. B23K 15/00
[52] U.S. Cl. ........................... 219/121.12; 219/121.15; 219/121.19
[58] Field of Search ............... 219/121 EA, 121 EE, 219/121 EF, 121 EJ, 121 EK, 121.34, 121.15, 121.16, 121.19, 121.2; 250/492.21, 492.23, 423 R; 156/643; 427/140

[56] References Cited

U.S. PATENT DOCUMENTS

| | | | |
|---|---|---|---|
| 4,367,429 | 1/1983 | Wang et al. | 250/423 R X |
| 4,426,582 | 1/1984 | Orlaff et al. | 250/423 R X |
| 4,457,803 | 7/1984 | Takigawa | 250/492.2 X |
| 4,567,398 | 1/1986 | Ishitani et al. | 250/423 R |
| 4,629,931 | 12/1986 | Clerk et al. | 250/423 R X |
| 4,639,301 | 1/1987 | Doherty et al. | 250/452.21 |
| 4,698,236 | 10/1987 | Kellogg et al. | 427/140 X |

FOREIGN PATENT DOCUMENTS

1384281  2/1975  United Kingdom .

OTHER PUBLICATIONS

Garvin, et al., *Applied Optics*, "Ion Beam Micromachining of Integrated Optics Components", vol. 13, No. 3, Mar. 1973, pp. 455–459.

*Primary Examiner*—C. L. Albritton
*Attorney, Agent, or Firm*—Paul R. Miller

[57] ABSTRACT

An apparatus for finishing patterns, for example, masks for chip manufacture is provided with an ion source the ion beam current strength of which can be adjusted at a comparatively low value for removing material therewith, for restoring opaque defects, and at a comparatively high current value for the deposition of material from the ion beam as such, for restoring clear defects. Particles which are not desired for the working can be removed from the ion beam by means of a particle discriminator.

11 Claims, 1 Drawing Sheet

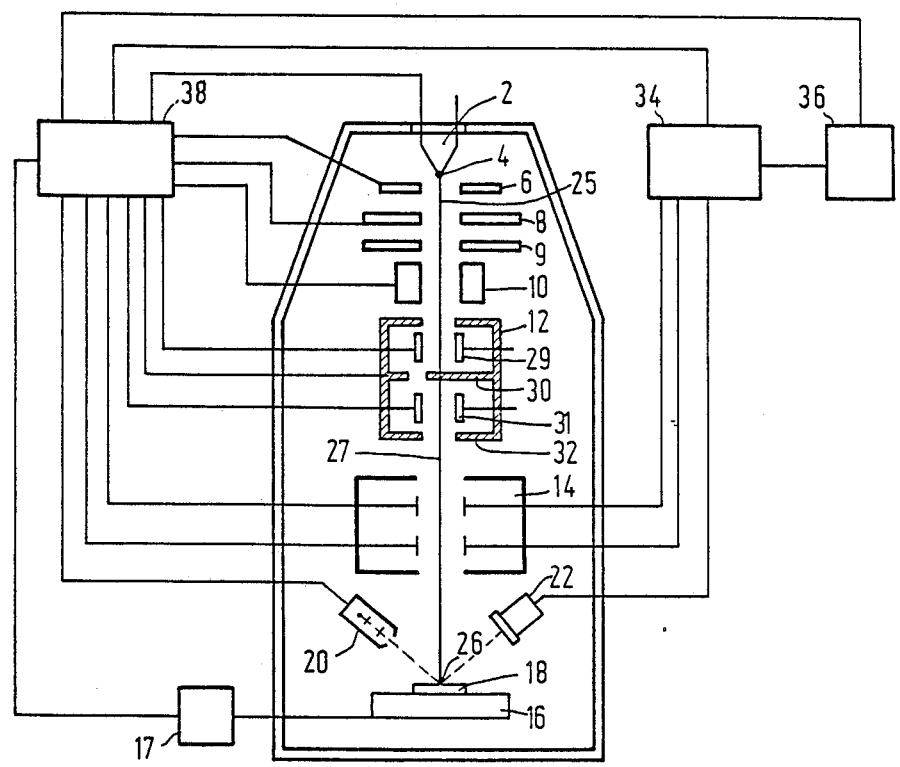

ION BEAM APPARATUS FOR FINISHING PATTERNS

The invention relates to an apparatus for finishing patterns provided at a surface of a carrier by means of an ion beam starting from a liquid metal ion source for the depositon and/or removal of material at the site.

Such an apparatus is disclosed in patent application No. WO 86/02774. In an apparatus described in this application material is deposited on the carrier by an ion beam from a supplied gas flow. Disadvantages of this method are that the supplied gas which can only very partly be ionised, pollutes the apparatus and that the accuracy of material deposition is restricted by scattering of the ions of the gas flow. This latter is particularly unfavourable for the use, for example, in repair or adaptations of chips or more in particular of masks for chip production. An accurate, sharply bounded material deposition is of decisive importance. Corresponding requirements, though they may be less stringent, are also imposed, for example, for repair or adaptation of gratings to be used, for example, for optical or X-rays spectroscopy, as described in British Patent No. 1,384,281. In both examples patterns are used with structures of at most, for example, approximately 1 $\mu$m and for a good finishing thereof an active ion spot diameter of at most a few tenths of a $\mu$m is necessary. In particular for masks to be used in electron beam apparatuses or in X-ray apparatuses, it is difficult to achieve sufficient definition in material deposition from a gas flow because, due to the required radiation absorption of the material, the gas flow must comprise atoms with a comparative large mass. The scattering will become larger due to the mass ratio which is more unfavourable with respect to the source ions.

For a finishing apparatus for the patterns it is favourable that it is suitable for both material removal and for material deposition with a transverse dimension of at most approximately 0.1 $\mu$m for the writing ion spot, that material which is also useful for subsequent processing with X-rays and electrons can be deposited, that material can be rapidly removed and be deposited, and that a good location control during the treatment is possible.

It is the object of the invention to remove the disadvantages of existing apparatuses and to satisfy the requirements to be imposed to a considerable extent, and for that purpose a finishing apparatus of the type mentioned in the opening paragraph is characterized according to the invention in that both for material removal and for material deposition use may be made of an ion beam starting from the ion source as such with the ion beam current being adjustable at a comparatively low value for material removal and at a comparatively high value for material deposition.

Because in an apparatus according to the invention a gas flow for material deposition is not used, both pollution of the apparation and scattering of the ion beam are avoided.

In a preferred embodiment the ion beam current for material removal can be adjusted at most at approximately 10 $\mu$A and at least at approximately 30 $\mu$A for material deposition. Energy up to approximately 10 keV may be used for material removal and up to many tens of keV for material deposition. For an unambiguous apparatus design it may be favourable to work in both modes with at least approximately equal ion energy.

A further preferred embodiment is constructed with only electrostatic ion optical elements for focusing and deflection of the ion beam. As a result of this, dispersion of ions or other positively charged particles of equal energy is avoided. If on the contrary it is desired to separate mutual different charge carriers, magnetic deflection systems may be used in which for the removal of only non-charged particles without dispersion of the charged particles two mutually compensating magnetic deflection devices or a combination of magnetic and electrostatic fields may be used. One of these deflection devices may also serve as a beam interrupter.

In a further embodiment the ion source is a liquid gold source with which gold is deposited which is favourable in particular as a material which is sparingly transparent for electrons and X-rays.

In a further embodiment, an electron source directed to the object is incorporated for the neutralisation of detrimental local charge optionally occurring on the carrier during the treatment. An electron source which is readily directed and focused on the object may also be used for location indication but preferably the ion beam itself is used for this purpose. For the detection of a location signal the apparatus may comprise a detector which is suitable for that purpose.

A few preferred embodiments according to the invention will now be described in greater detail hereinafter with reference to the accompanying drawing. The sole FIGURE of the drawing shows diagrammatically an apparatus according to the invention.

An apparatus as shown diagrammatically in the drawing comprises in a housing 1 to be evacuated, an ion source 2 having an emission point 4 conventionally operated at high voltage, an extraction electrode 6, a second electrode 8, a high voltage electrode 9, a beam focusing device 10, a beam deflection device 12, a beam deflection device 14 and an object table 16 having thereon an object 18 to be worked. An object moving system 17 for moving the object, for example in X-Y coordinates is attached to the object table. An electron source 20 and a detector 22 are furthermore incorporated in the housing and are directed on the object. The ion source in this case is a liquid metal ion source (LMIS) and comprises in general a sharp emission point to be heated on which a layer of, for example, gold, aluminium, silicon, boron, gallium or another useful metal or a combination of material has been provided in which the material to be used, which in this case is not necessarily a metal form, is incorporated, for example, AuSi, Pt Nib, etc. During operation of the apparatus the layer of material is in the liquid phase. The current strength of the ion beam may be varied by means of the extraction electrode 6 between, for example, a few $\mu$A and 150 $\mu$A or more. A potential to be applied to the high voltage electrode 9 which conventionally is at least substantially equal to the potential of the object determines the energy of the ions in an ion beam 25 to be emitted. The ion beam can be focused in a small working spot 26 by means of the focusing device. A surface of the object 18 to be worked can be scanned by means of the beam deflection device 14 in a grating or a vector scanning method. The beam deflection device is necessary only when it is desired to purify the ion beam 25 of neutral particles, comparatively heavy charged particles, multiple ions, and the like, optionally occurring in the beam. The ion beam is first, for example, deflected away from an optical system axis 27 and is then made to coincide again with this axis. For the mode for removal of material, usually termed sputtering, in which the ion source is adjusted at a comparatively low current value, a good homogeneous ion beam is emitted. For particle selection the deflection device then is superfluous. This may also be used as a beam interrupter, for example, by switching on and off a first deflection element 29 in which the beam impinges on an asymmetrically placed diaphragm 30 or when the second deflection element 31 is switched off, the beam impinging on a diaphragm 32. When this form of beam blanking is not desired, for example, because the source has to be switched on and off, the diaphragm 30 is removed from the main axis of the system. Undesired material may be removed from a carrier surface by means of such a low current ion beam. For example, for that purpose a mask may be controlled for the defects in a separate apparatus designed for that purpose or by means, for example, of a focused electron source 20 and detector 22 adapted thereto or by means of a rapidly scanning ion beam in the finishing apparatus itself. An image of a pattern may be formed, for example, via a signal processing device 34 and be stored and displayed in an image recording display device 36. The ion source may then be controlled with an object with coordinated locations to be treated and associated with a central control device 38 for which purpose the relevant components of the apparatuses influencing the ion beam are connected to the central control device. Potential excursions, if any, generated by the ion beam at the carrier surface may be neutralised by means of the electron gun 20. For location of the instantaneous position of the ion beam during processing of the carrier surface it is favourable to use a signal created at the area by the ion beam itself. Where this meets with difficulties, location can also be realized by means of a synchronously scanning electron beam of the electron gun 20 now focused on the object.

For material deposition purposes an ion beam is used with which more material is deposited then is sputtered away. For a more rapid deposition the ion beam current may be increased in which, for example, more and more material is displaced between about 25 and 75 $\mu$A and in which the mass transport increases more rapidly than the current strength. The more, since it is suggested that charged clusters of material are then also formed, material must consequently be taken along in a form other than ions. It is assumed that in particular charged particles of material but also non-charged particles of material occur in the beam. When the current strength becomes comparatively high, particles of material may occur which are too large to be able to satisfy the desired resolving power. These undesired particles can then be sieved out exactly by the deviating charge-mass ratio, by means of the deflection device and an intensive beam of sufficiently small particles may be used. In order to neutralise the dispersion occurring in such a deflection, the deflection system may be given a double construction. In addition to the advantage that the gas supply in the apparatus is avoided, the apparatus has the further great advantage that both types of defects, namely the presence of material where it should not be and the absence of material where it should be, can be restored or replenished in one apparatus. Because in the restorage of clear defects, at locations where no or too little material is erroneously present, material is really added and a scattering surface is not formed at the area as, for example, is done for optical masks, the apparatus, equipped with an ion source suitable for that purpose, is also suitable for masks for X-ray or electron lithography, for example. Furthermore, a wide adjusting range is possible between on the one hand a shape edge resolution for fine structures in the patterns with an ion beam current up to, for example, approximately 100 to 150 $\mu$A, and on the other hand a very rapid working of coarser structures with current intensities up to, for example, 500 $\mu$A. While maintaining a rapid working, a high beam current and an active particle selection system in the apparatus may be used. Particles having, for example, a mass above a value to be fixed may then be removed from the beam. Because it is always source material, the particle mass and the particle dimensions are directly correlated. When no dispersion in the apparatus is desired, all the ion optical elements are constructed to be electrostatic. Under the real assumption that the energy of all charged particles is mutually at least substantially equal, no dispersion consequently occurs upon deflection and neutral particles can yet be removed. An argument in favour of selection may be, in addition to the removal of optionally too large and neutral particles, that a particle beam is selected having such an equal scanning influencing by deflection fields other than the electrostatic fields that the occurrence of, for example, spot increase or deformation by increasing scanning angle is avoided.

What is claimed is:

1. An apparatus for both removing and replenishing material at a surface of a carrier comprising
   a liquid metal ion source generating an ion beam onto the surface of the carrier,
   means for adjusting ion beam current from a comparatively low value for material removal to a comparatively high value for material deposition.
2. An apparatus according to claim 1, wherein said ion beam current is adjusted to approximately 30 to 150 $\mu$A for material deposition.
3. An apparatus according to claim 1, wherein said ion beam is adjusted to a substantially equal ion energy for both material removal and material deposition.
4. An apparatus according to claim 1 or 2 or 3, wherein electrostatically operating ion optical means are disposed between said ion source and an object at said surface for focusing and deflecting said ion beam.
5. An apparatus according to claim 1 or 2 or 3, wherein deflection means are disposed in said ion beam for selectively operating on charge-mass ratios of charged particles in said ion beam.
6. An apparatus according to claim 5, wherein said deflection means includes a first and a second deflection element, said second deflection element compensating for energy dispersion of said ion beam by said first deflection element.
7. An apparatus according to claim 1 or 2 or 3, wherein an electron source is disposed to neutralize potential excursions at said surface of said carrier caused by said ion beam.
8. An apparatus according to claim 1 or 2 or 3, wherein detection means is disposed laterally of said surface of said carrier for controlling positions of a target of said ion beam on said surface.
9. An apparatus according to claim 8, wherein said detection means is a SEM detection system.
10. An apparatus according to claim 1 or 2 or 3, wherein said liquid metal ion source is a liquid gold ion source.
11. An apparatus according to claim 1 or 2 or 3, wherein deflection means are disposed for deflecting said ion beam, said deflection means including a double beam deflection system having an element being switchable, said switchable element being a beam interrupter.

* * * * *